(12) United States Patent
Byeon et al.

(10) Patent No.: US 9,455,276 B2
(45) Date of Patent: Sep. 27, 2016

(54) THIN FILM TRANSISTOR ARRAY PANEL AND METHOD OF MANUFACTURING THE SAME

(71) Applicant: Samsung Display Co., Ltd., Yongin, Gyeonggi-do (KR)

(72) Inventors: Hee Jun Byeon, Suwon-si (KR); Seung Sok Son, Asan-si (KR); Bo Sung Kim, Seoul (KR); Yeon Taek Jeong, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/456,154

(22) Filed: Aug. 11, 2014

(65) Prior Publication Data

US 2015/0162349 A1    Jun. 11, 2015

(30) Foreign Application Priority Data

Dec. 11, 2013  (KR) .................. 10-2013-0153832

(51) Int. Cl.
*H01L 27/12*      (2006.01)
*G02F 1/1362*    (2006.01)
*G02F 1/1343*    (2006.01)

(52) U.S. Cl.
CPC ....... *H01L 27/124* (2013.01); *G02F 1/136227* (2013.01); *H01L 27/1259* (2013.01); *G02F 1/134363* (2013.01)

(58) Field of Classification Search
CPC ............ H01L 27/124; H01L 27/1248; H01L 29/786; G02F 1/136; G02F 1/1343; G02F 1/136227

USPC ........ 349/39, 43, 106, 152; 438/586, 34, 30; 257/72

See application file for complete search history.

(56) References Cited

U.S. PATENT DOCUMENTS

| 8,343,787 B2 | 1/2013 | Lee et al. |
| 8,493,523 B2 | 7/2013 | Kim |
| 2012/0268396 A1* | 10/2012 | Kim et al. .................. 345/173 |
| 2013/0021552 A1 | 1/2013 | Tomioka et al. |
| 2014/0132875 A1* | 5/2014 | Yun et al. ................... 349/46 |
| 2014/0292626 A1* | 10/2014 | Park et al. .................. 345/87 |

FOREIGN PATENT DOCUMENTS

| JP | 2012-103343 A | 5/2012 |
| KR | 1020100099496 A | 9/2010 |
| KR | 1020120054838 A | 5/2012 |
| KR | 1020120113850 A | 10/2012 |

* cited by examiner

*Primary Examiner* — Cuong Q Nguyen
*Assistant Examiner* — Tong-Ho Kim
(74) *Attorney, Agent, or Firm* — Cantor Colburn LLP

(57) ABSTRACT

A thin film transistor array panel includes: a substrate; a gate line and a common voltage line on the substrate and electrically separated from each other; a gate insulating layer on the gate line and the common voltage line; a first passivation layer on the gate insulating layer; a common electrode on the first passivation layer; a second passivation layer on the common electrode; and a pixel electrode and a connecting member on the second passivation layer and electrically separated from each other. A first contact hole and a second contact hole are defined in the first and second passivation layers. The pixel electrode and the drain electrode are connected to each other through the second contact hole. The connecting member and the common electrode are connected to each other through the first contact hole.

11 Claims, 18 Drawing Sheets

A. Gate Contact

THIN FILM TRANSISTOR ARRAY PANEL AND METHOD OF MANUFACTURING THE SAME

This application claims priority to Korean Patent Application No. 10-2013-0153832 filed on Dec. 11, 2013, the entire contents of which are incorporated herein by reference.

BACKGROUND (a) Field

The invention relates to a thin film transistor array panel and a method of manufacturing the same.

(b) Description of the Related Art

A liquid crystal display is one of the most common types of flat panel displays, and includes two display panels with field generating electrodes, such as a pixel electrode and a common electrode, and a liquid crystal layer interposed therebetween. The liquid crystal display generates an electric field in the liquid crystal layer by applying voltage to the field generating electrodes, determines the direction of liquid crystal molecules of the liquid crystal layer, and controls polarization of incident light through the generated electric field to display images.

In the liquid crystal display, a region in which a gate conductor is disposed is light-blocked by a black matrix. This directly influences transmittance of the liquid crystal display. Accordingly, in order to improve transmittance of the liquid crystal display, it is desirable to decrease a size of the region in which the gate conductor is disposed.

SUMMARY

One or more exemplary embodiment of the invention has provides a thin film transistor array panel, which simplifies a manufacturing process thereof and improves transmittance by contacting a common electrode with a common voltage line through one single contact hole, and a method of manufacturing the same.

An exemplary embodiment of the invention provides a thin film transistor array panel, including: a substrate; a drain electrode of a thin film transistor, on the substrate; a gate line and a common voltage line on the substrate and electrically separated from each other; a gate insulating layer on the gate line and the common voltage line; a first passivation layer on the gate insulating layer; a common electrode on the first passivation layer; a second passivation layer on the common electrode; and a pixel electrode and a connecting member on the second passivation layer and electrically separated from each other. A first contact hole and a second contact hole are defined in the first and second passivation layers. The pixel electrode and the drain electrode are connected to each other through the second contact hole. The connecting member and the common electrode are connected to each other through the first contact hole.

The thin film transistor array panel may further include an organic layer between the first passivation layer and the common electrode.

The first contact hole may be defined in each of the first passivation layer, the organic layer, and the second passivation layer, and a width of the first contact hole at the first passivation layer may be smaller than a width of the first contact hole at the organic layer and the second passivation layer.

A portion of the first contact hole at the first passivation layer may expose the common voltage line and the substrate.

The connecting member may be in contact with the common voltage line via the first contact hole.

A portion of the first contact hole at the organic layer and the second passivation layer may expose the common electrode.

The connecting member may be in contact with the common electrode via the first contact hole.

The connecting member may be in contact with a portion of the common electrode, on the first passivation layer and adjacent to the first contact hole.

The gate line to which a voltage is applied, may be in contact with the pixel electrode via the second contact hole and may apply the voltage to the pixel electrode.

The common voltage line to which a common voltage is applied, may be in contact with the common electrode via the first contact hole and may apply the voltage to the common electrode.

The connecting member may be vertically elongated in an upper region of the first contact hole, and opposing edge regions of the connecting member are flat on a portion of the first passivation layer, adjacent to the first contact hole.

A portion of the first contact hole at the first passivation layer may expose the common voltage line and may not expose the substrate.

An end of the common electrode at the first contact hole may overlap the common voltage line.

Another exemplary embodiment of the invention provides a method of manufacturing a thin film transistor array panel, including: forming a gate conductor including a gate line and a common voltage line on a substrate; forming a gate insulating layer, a first passivation layer, and an organic layer on the gate conductor; etching the organic layer and exposing a part of the first passivation layer to form a first portion of a first contact hole; forming a common electrode on the organic layer and the exposed portion of the first passivation layer; forming a second passivation layer on the exposed portion of the first passivation layer, the organic layer and the common electrode; etching the first passivation layer, the organic layer, and the second passivation layer, to form a second portion of the first contact hole exposing portions of each of the common electrode, the substrate and the common voltage line; and forming a connecting member on each of the exposed portions of the common electrode, the substrate and the common voltage line.

A width of the second portion of the first contact hole may be larger than a width of the first portion of the first contact hole.

A portion of the connecting member may extend from the exposed portion of the common voltage line to the exposed portion of the common electrode, a first side of the portion of the connecting member may be in contact with the exposed portion of the common voltage line, and an opposing second side of the portion of the connecting member may be in contact with the exposed portion of the common electrode.

The connecting member may be in contact with a portion of the common electrode, on the first passivation layer and adjacent to the first contact hole.

The connecting member may be vertically elongated in an upper region of the first contact hole, and opposing edge regions of the connecting member may be flat on a portion of the first passivation layer adjacent to the first contact hole.

According to one or more exemplary embodiment of the thin film transistor array panel and the method of manufacturing the same of the invention, the common electrode is in contact with the common voltage line through one single contact hole, thereby simplifying a manufacturing process and improving transmittance.

BRIEF DESCRIPTION OF THE DRAWINGS

The above and other features of this disclosure will become more apparent by describing in further detail exemplary embodiments thereof with reference to the accompanying drawings, in which.

DETAILED DESCRIPTION

Figure 1:
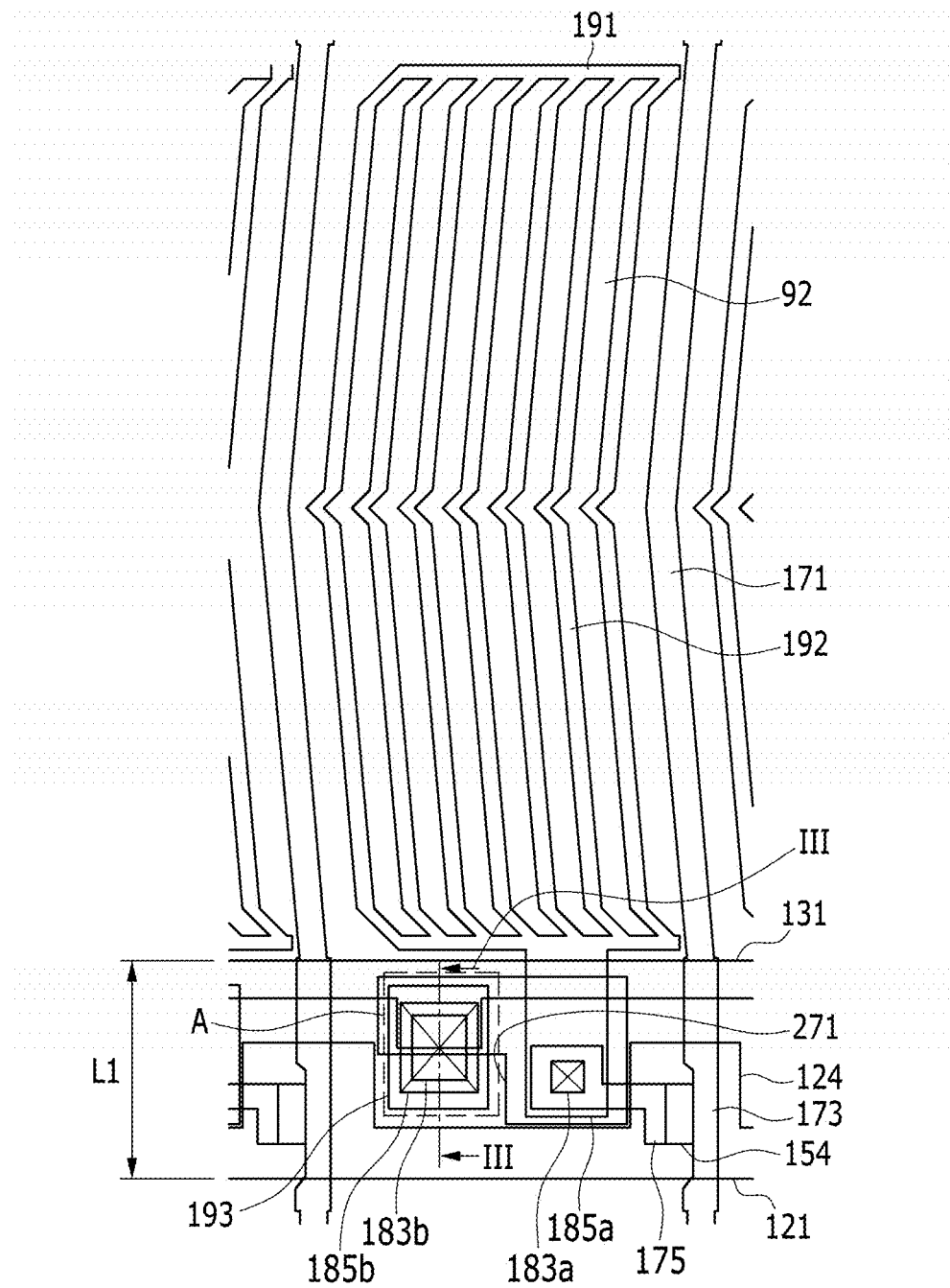
FIG. 1 is a plan view of an exemplary embodiment of a thin film transistor array panel according to the invention.

The invention will be described more fully hereinafter with reference to the accompanying drawings, in which exemplary embodiments of the invention are shown. As those skilled in the art would realize, the described exemplary embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention. Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "below" can encompass both an orientation of above and below. The device may be otherwise oriented (rotated 90 degrees or at other orientations) and the spatially relative descriptors used herein interpreted accordingly. The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Now, exemplary embodiments of a thin film transistor array panel according to the invention and a method of manufacturing the same will be described in detail with reference to the drawings.

First, an exemplary embodiment of a thin film transistor array panel according to the invention will be described with reference to FIGS. 1 to 4.

Figure 2:
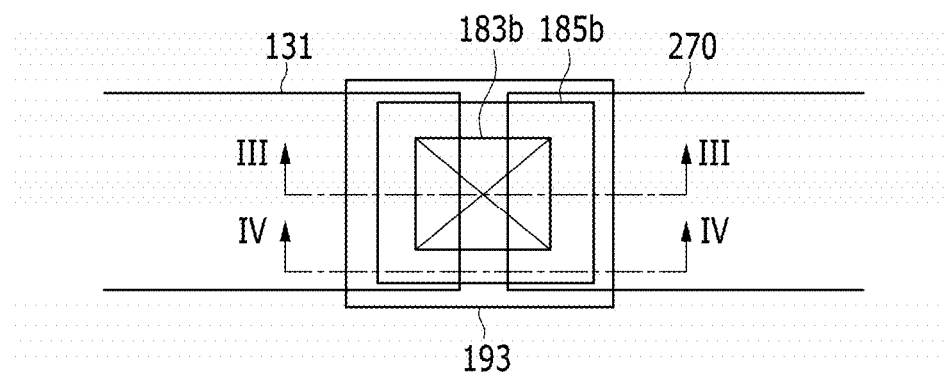
FIG. 2 is an enlarged plan view illustrating region A of the thin film transistor array panel of FIG. 1.
Figure 3:
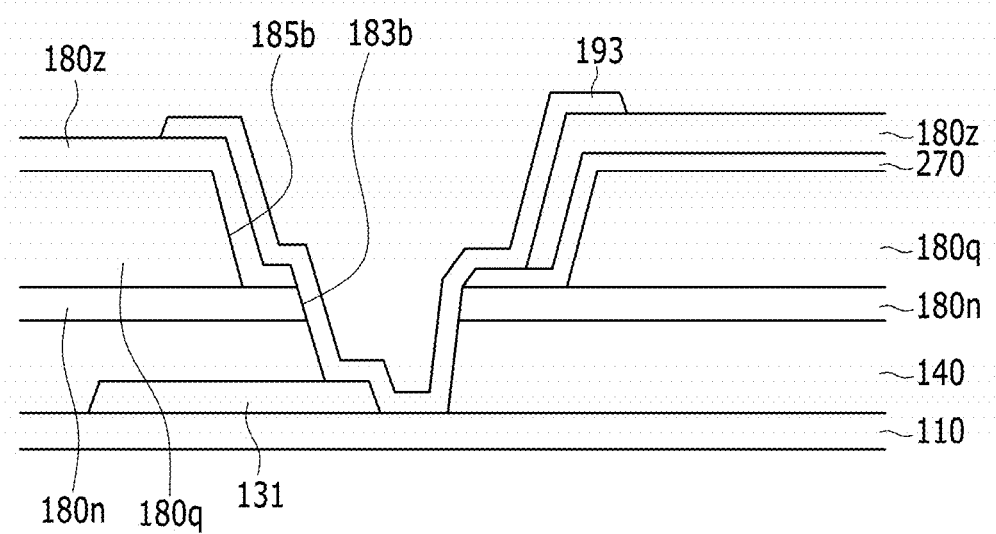
FIG. 3 is a cross-sectional view illustrating the thin film transistor array panel taken along line III-III in FIG. 1 and FIG. 2.
Figure 4:
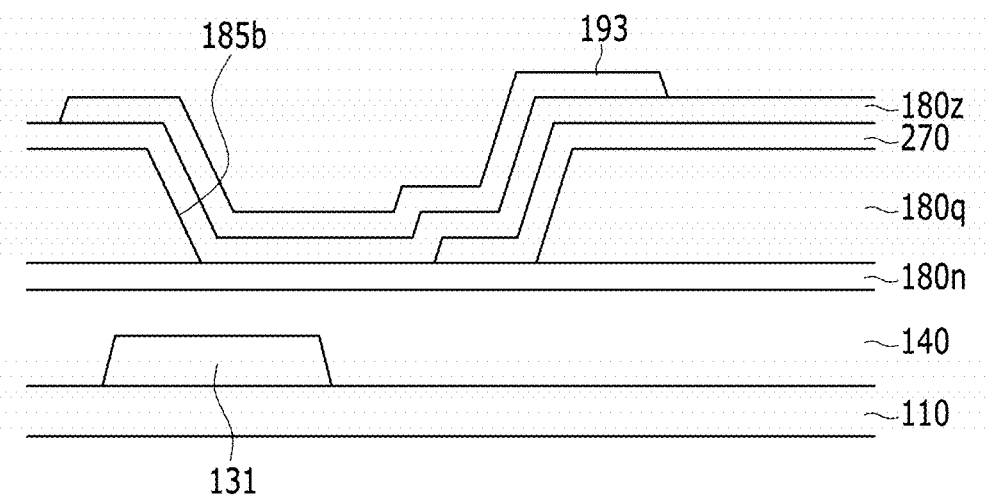
FIG. 4 is a cross-sectional view illustrating the thin film transistor array panel taken along line IV-IV in FIG. 2.

FIG. 1 is a plan view of an exemplary embodiment of a thin film transistor array panel according to the invention. FIG. 2 is an enlarged plan view illustrating region A of the thin film transistor array panel of FIG. 1. FIG. 3 is a cross-sectional view illustrating the thin film transistor array panel taken along line III-III in FIG. 1 and FIG. 2. FIG. 4 is a cross-sectional view illustrating the thin film transistor array panel taken along line IV-IV in FIG. 2.

First, the exemplary embodiment of the thin film transistor array panel will be described with reference to FIGS. 1 and 3.

A gate conductor including a gate line 121 and a common voltage line 131 are disposed on an insulating substrate 110. The insulating substrate 110 includes transparent glass, plastics, or the like.

The gate line 121 includes a gate electrode 124, and a wide end portion (not illustrated) for connection with another layer or an external driving circuit (not shown).

The gate line 121 may include an aluminum-based metal, such as aluminum (Al) or an aluminum alloy, a silver-based metal, such as silver (Ag) or a silver alloy, a copper-based metal, such as copper (Cu) or a copper alloy, a molybdenum-based metal, such as molybdenum (Mo) or a molybdenum alloy, chromium (Cr), tantalum (Ta), and titanium (Ti). The gate line 121 may have a multilayered structure including two conductive layers having different physical properties.

A gate insulating layer 140 including silicon nitride (SiNx), silicon oxide (SiOx), or the like is disposed on the gate conductor 121. The gate insulating layer 140 may have a multilayered structure including two insulating layers having different physical properties.

The common voltage line 131 may be parallel to the gate line 121 and include the same material as that of the gate line 121. The common voltage line 131 and the gate conductor may be in a same layer. The common voltage line 131 transfers a predetermined common voltage, and includes an expanded portion for connection with a common electrode 270. As illustrated in FIG. 1, the expanded portion of the common voltage line 131 protrudes downward from a main portion thereof, and toward the common electrode 270.

A semiconductor 154 including amorphous silicon, polysilicon, or the like is disposed on the gate insulating layer 140. The semiconductor 154 may include an oxide semiconductor.

Ohmic contacts (not illustrated) are disposed on the semiconductor 154. The ohmic contact may include a material, such as n+ hydrogenated amorphous silicon in which an n-type impurity, such as phosphorus, is doped at a high concentration, or silicide. The ohmic contacts may form a pair disposed on the semiconductor 154. Where the semiconductor 154 is the oxide semiconductor, the ohmic contacts may be omitted.

A data conductor including a data line 171 including a source electrode 173 and a drain electrode 175 is disposed on the ohmic contacts and the gate insulating layer 140.

The data line 171 includes a wide end portion (not illustrated) for connection with another layer or an external driving circuit. The data line 171 transfers a data signal and mainly extends in a vertical direction in the top plan view of FIG. 1, to cross the gate line 121.

In an exemplary embodiment, the data line 171 may have a first bent portion having a bent shape in order to obtain maximum transmittance of the liquid crystal display. Bent portions of the first bent portion may meet each other in a middle region of a pixel region to form a "V" shape. A second bent portion (not shown) that is further bent with respect to the first bent portion so as to have a predetermined angle with the first bent portion, may be further included in the middle region of the pixel region.

In one exemplary embodiment, the first bent portion of the data line 171 may be inclined so as to form an angle of about 7° with respect to a vertical reference line y (a reference line extending in a y direction, e.g., vertical in the top plan view of FIG. 1) which is inclined at about 90° with respect to a direction (x direction, e.g., horizontal in the top plan view of FIG. 1) in which the gate line 121 extends. The second bent portion disposed in the middle region of the pixel region may be further bent so as to form an angle of about 7° to about 15° with respect to the first bent portion.

The source electrode 173 is a continuous portion of the data line 171, and disposed on the same extension line as that of the data line 171. The drain electrode 175 extends in parallel to the source electrode 173. Accordingly, the drain electrode 175 is parallel to the portion of the data line 171 defining the source electrode 173.

The gate electrode 124, the source electrode 173, and the drain electrode 175 form a thin film transistor ("TFT") together with the semiconductor 154. A channel of the TFT is formed by the semiconductor 154 which is exposed between the source electrode 173 and the drain electrode 175.

The data line 171 and the drain electrode 175 may include refractory metal, such as molybdenum, chromium, tantalum and titanium, or an alloy thereof, and may have a multilayered structure including a refractory metal layer (not illustrated) and a low resistance conductive layer (not illustrated). Examples of the multilayered structure may include a double layer of a chromium or molybdenum (alloy) lower layer and an aluminum (alloy) upper layer, and a triple layer of a molybdenum (alloy) lower layer, an aluminum (alloy) intermediate layer, and a molybdenum (alloy) upper layer. However, the data line 171 and the drain electrode 175 may include various metals or conductors in addition to the aforementioned structures. The data line 171 is elongated in an extension direction, and a width of the data line 171 is taken perpendicular to the extension direction. The width of the data line 171 may be about 3.5 micrometers (μm)±0.75 μm.

A first passivation layer 180n is disposed on exposed portions of the data conductors 171, 173 and 175, the gate insulating layer 140, and the semiconductor 154. The first passivation layer 180n may include an organic insulating material, an inorganic insulating material, or the like.

An organic layer 180q is disposed on the first passivation layer 180n.

The common electrode 270 is disposed on the organic layer 180q. The common electrode 270 is a surface shape and has a planar shape, on a front surface of the substrate 110. An opening 271 is defined in the common electrode 270 at a region corresponding to a surrounding region of the drain electrode 175.

The common electrode 270 may be physically and electrically connected with the common voltage line 131 through a second contact hole 183b defined in the first passivation layer 180n and a second contact hole 185b defined in the organic layer 180q to receive the common voltage having a predetermined size from the common voltage line 131. The common electrode 270 receives the common voltage from the common voltage line 131 through a connecting member 193 disposed in the second contact holes 183*b* and 185*b*. A particular contact type will be described below.

The opening 271 of the common electrode 270 has an "L" shape rotated 180° in a clockwise direction. A vertically extending portion of the opening 271 exposes first contact holes 183*a* and 185*a* which expose the drain electrode 175. Further, a horizontally extended portion of the opening 271 is disposed to overlap a part of the second contact holes 183*b* and 185*b*, and has a size corresponding to a size of the expanded portion of the common voltage line 131 in the plan view. That is, the opening 271 of the common electrode 270 has a shape, such as a quadrangle of which only three quarters of the area exists. The first contact holes 183*a* and 185*a* and the second contact holes 183*b* and 185*b* are respectively disposed at ends of the horizontally extended portion and the vertically portion of the opening 271.

The connecting member 193 is disposed on and in the second contact holes 183*b* and 185*b*. A portion of the connecting member 193 overlaps the opening 271 of the common electrode 270. That is, in the plan view, the connecting member 193 extends vertically to overlap the horizontal portion of the opening 271 of the common electrode 270, and a vertical length of the portion of the connecting member 193 overlapping the horizontal portion of the opening 271 is similar to a vertical length of the opening 271 of the common electrode 270.

A second passivation layer 180*z* is disposed on the common electrode 270. The second passivation layer 180*z* may include an organic insulating material, an inorganic insulating material or the like.

A pixel electrode 191 and the connecting member 193 are disposed on the second passivation layer 180*z*. The pixel electrode 191 includes a curved edge that is substantially parallel to the first bent portion and the second bent portion of the data line 171. A plurality of cutouts is defined in the pixel electrode 191. The pixel electrode 191 includes a plurality of first branch electrodes 192 defined by the plurality of first cutouts 92. The pixel electrode 191 and the connecting member 193 may include the same material. In an exemplary embodiment of manufacturing a TFT array panel, the pixel electrode 191 and the connecting member 193 may be formed by a simultaneous process and/or in a same layer.

The first contact holes 183*a* and 185*a* exposing the drain electrode 175 are defined in the first passivation layer 180*n*, the organic layer 180*q* and the second passivation layer 180*z*. The first contact hole 183*a* defined in the first passivation layer 180*n* is smaller than the first contact hole 185*a* defined in the organic layer 180*q* and the second passivation layer 180*z*.

The pixel electrode 191 is physically and electrically connected to the drain electrode 175 through the first contact holes 183*a* and 185*a* to receive a voltage from the drain electrode 175.

The second contact holes 183*b* and 185*b* exposing a part of the common voltage line 131 are defined in the first passivation layer 180*n*, the organic layer 180*q* and the second passivation layer 180*z*. The second contact hole 183*b* defined in the first passivation layer 180*n* is smaller than the second contact hole 185*b* defined in the organic layer 180*q* and the second passivation layer 180*z*.

The connecting member 193 is physically and electrically connected with the common voltage line 131 through the second contact holes 183*b* and 185*b* to receive a voltage from the common voltage line 131.

The common electrode 270 is disposed to be physically and electrically separated from the common voltage line 131. However, the common electrode 270 is connected with the connecting member 193 disposed in the opening 271 of the common electrode 270, so that the common electrode 270 receives a voltage from the common voltage line 131 through the connecting member 193.

An exemplary embodiment of a voltage application structure of the common electrode according to the invention will be described in more detail with reference to FIGS. 2 to 4.

FIG. 2 is an enlarged view illustrating region A indicated by a dotted line in FIG. 1.

Referring to FIG. 2, the common voltage line 131 and the common electrode 270 are horizontally and vertically spaced apart from each other by a distance therebetween. However, the connecting member 193 is disposed to partially overlap the common voltage line 131 and the common electrode 270, and is in contact with the common voltage line 131 and the common electrode 270 through the second contact hole 183*b* defined in the first passivation layer 180*n* and the second contact hole 185*b* defined in the organic layer 180*q*, so that the connecting member 193 physically and electrically connects the common electrode 270 and the common voltage line 131 to each other.

Referring to FIGS. 2 and 3, the second contact holes 183*b* and 185*b* defined in the first passivation layer 180*n* and the organic layer 180*q* expose parts of the common voltage line 131 and the insulating substrate 110. A width of the second contact hole 183*b* defined in the first passivation layer 180*n* is smaller than that of the second contact hole 185*b* defined in the organic layer 180*q*. Widths of the second contact holes 183*b* and 185*b* may be taken in the vertical and/or horizontal directions in the plan view.

Accordingly, the common electrode 270 disposed on the organic layer 180*q* is extended along a slope of the second contact hole 185*b* of the organic layer 180*q*, and is also partially disposed on the first passivation layer 180*n*. That is, a horizontal portion of the common electrode 270 is disposed on the first passivation layer 180*n*. In a plan view, an area of the horizontal portion disposed on the first passivation layer 180*n* corresponds to a size difference between the second contact hole 185*b* of the organic layer 180*q* and the second contact hole 183*b* of the first passivation layer 180*n*.

The connecting member 193 is disposed on the second passivation layer 180*z*, but is in contact with the common voltage line 131, the insulating substrate 110 and the common electrode 270 through the second contact holes 183*b* and 185*b* defined in the first passivation layer 180*n* and the organic layer 180*q*.

Accordingly, the connecting member 193 receives a voltage from the common voltage line 131 and transfers the received voltage to the common electrode 270.

As described above, in the exemplary embodiment of the TFT array panel according to the invention, the connecting member 193 is in contact with the common voltage line 131, and the connecting member 193 is in contact with the common electrode 270, via one contact hole (e.g., 183*b* and 185*b* collectively forming a single second contact hole). That is, the common voltage line 131 is connected with the common electrode 270 through the single collective second contact hole.

The pixel electrode 191 is also in contact with the drain electrode 175 through via one contact hole (e.g., 183*a* and 185*a* collectively forming a single first contact hole). That is, pixel electrode 191 is connected with the drain electrode 175 through the single collective first contact hole.

Accordingly, in the TFT array panel, a pixel region includes the single first contact hole connecting the pixel electrode 191 and the drain electrode 175 to each other, and the single second contact hole connecting the common voltage line 131 and the common electrode 270 to each other. That is, a total of two contact holes are disposed in one pixel region.

In a TFT array panel according to a Comparative Example, a common electrode 270 and a common voltage line 131 are connected to each other through two contact holes. One contact hole connects the common electrode 270 and a connecting member 193, and the other contact hole connects the common voltage line 131 and the connecting member 193. Accordingly, a pixel region of the TFT array panel includes a total of three contact holes, which increases the number of processes in a manufacturing method of the TFT array panel, and increases a space for forming the contact holes, thereby decreasing transmittance. However, in one or more exemplary embodiment of the TFT array panel according to the invention, the common electrode 270 and the common voltage line 131 are connected with each other through one single contact hole, so that the number of processes in a manufacturing method of a TFT array panel is decreased, and transmittance is improved.

Figure 5:
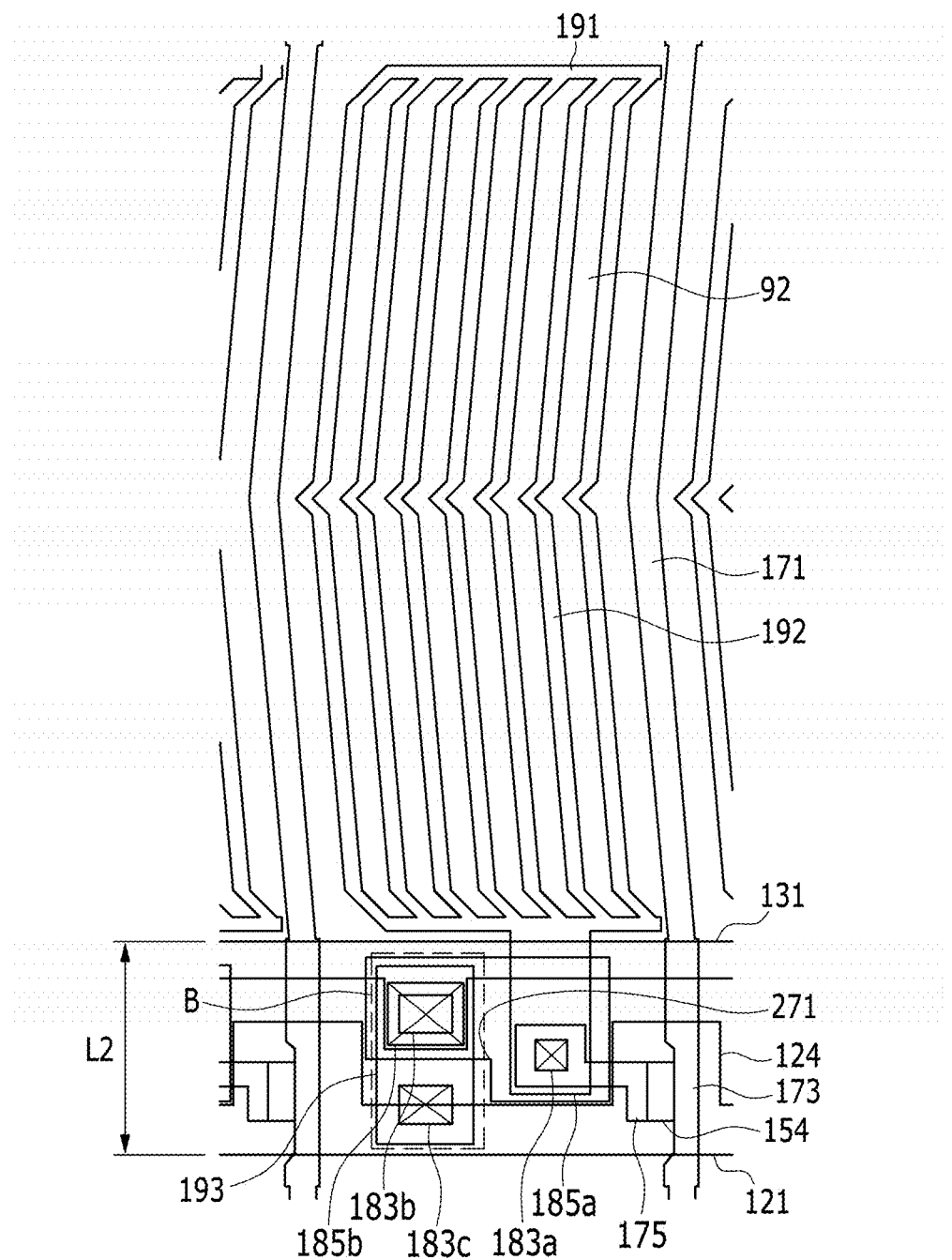
FIG. 5 is a plan view of a thin film transistor array panel according to a Comparative Example.
Figure 6:
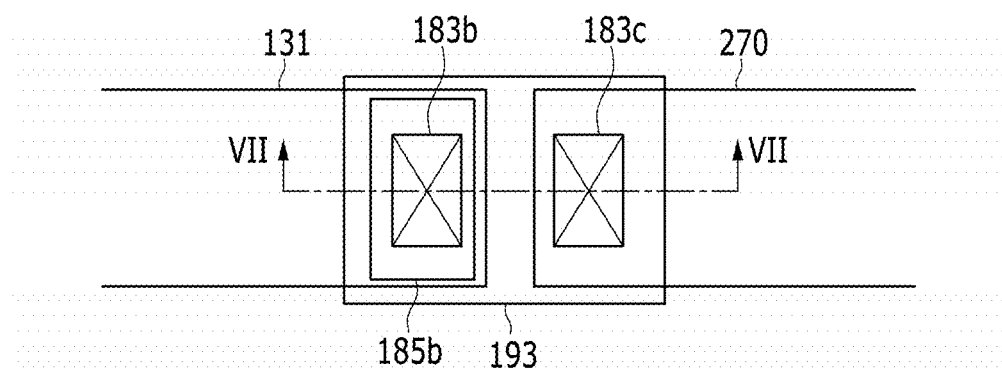
FIG. 6 is an enlarged plan view illustrating region B of the thin film transistor array panel of FIG. 5.
Figure 7:
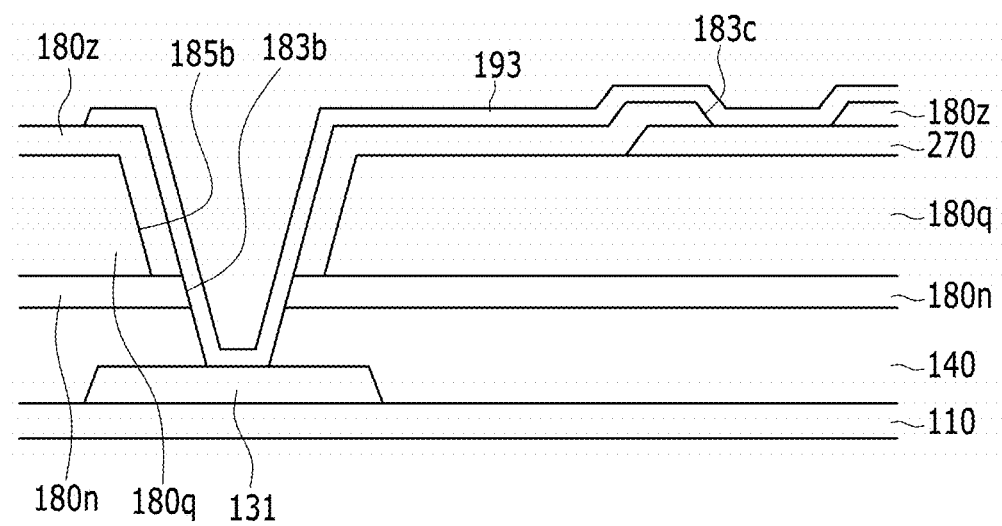
FIG. 7 is a cross-sectional view illustrating the thin film transistor array panel in FIG. 5 taken along line VII-VII in FIG. 6.

A TFT array panel according to the Comparative Example will be described with reference to FIGS. 5 to 7. FIG. 5 is a plan view of the TFT array panel according to the Comparative Example. FIG. 6 is an enlarged plan view illustrating region B of the TFT array panel of FIG. 5. FIG. 7 is a cross-sectional view illustrating the TFT array panel taken along line VII-VII in FIG. 6.

Referring to FIGS. 6 and 7, a second contact hole 183b defined in a first passivation layer 180n and a second contact hole 185b defined in an organic layer 180q are disposed on the common voltage line 131. The common voltage line 131 is in contact with the connecting member 193 through the second contact holes 183b and 185b.

A third contact hole 183c is defined in a second passivation layer 180z on the common electrode 270. The common electrode 270 is in contact with the connecting member 193 through the third contact hole 183c.

That is, the second contact holes 183b and 185b for the contact between the common voltage line 131 and the connecting member 193 and the third contact hole 183c for the contact between the connecting member 193 and the common electrode 270 are defined in a pixel area of the TFT array panel according to the Comparative Example. Accordingly, the common electrode 270 receives a voltage from the common voltage line 131 by the connecting member 193 through the second contact holes 183b and 185b (e.g., collectively single second contact hole) and the third contact hole 183c (e.g., single third contact hole).

In the Comparative Example, the two single contact holes are formed, so that a process in a manufacturing method of the TFT array panel is complex, and a space for forming the two single contact holes is increased which causes a decrease in transmittance. Referring to FIG. 5, a region, in which a gate conductor, a TFT, and the like are positioned so that light is blocked by a black matrix, is L2. However, in an exemplary embodiment of the TFT array panel according to the invention, that is, referring to FIG. 1, the region, which is light-blocked by the black matrix, is illustrated as L1.

The two single contact holes 183b/185b and 185c are disposed vertically formed in L2 of FIG. 5, so that L2 requires a predetermined vertical length. However, only one single contact hole 183b/185b is disposed in the vertical direction in L1 of FIG. 1, so that L1 is smaller than L2 in the vertical direction. Accordingly, one or more exemplary embodiment of the TFT array panel according to the invention may improve transmittance.

Figure 8:
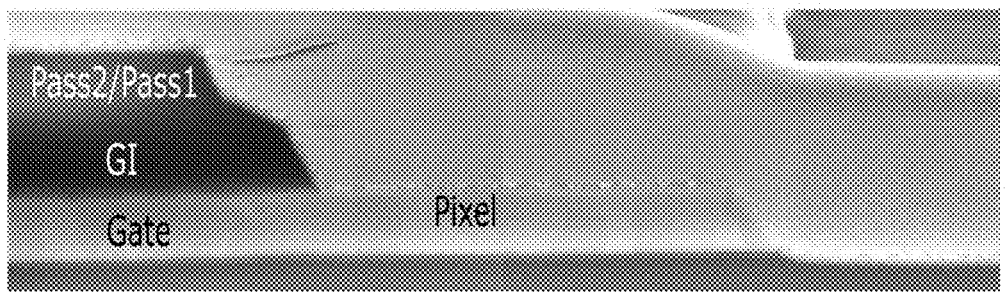
FIGS. 8 to 10 are images of cross-sections of a stack of an exemplary embodiment of the thin film transistor array panel according to the invention.
Figure 9:
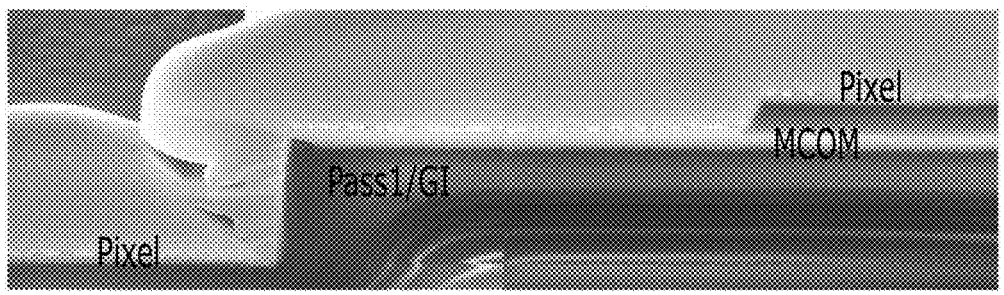
Figure 10:
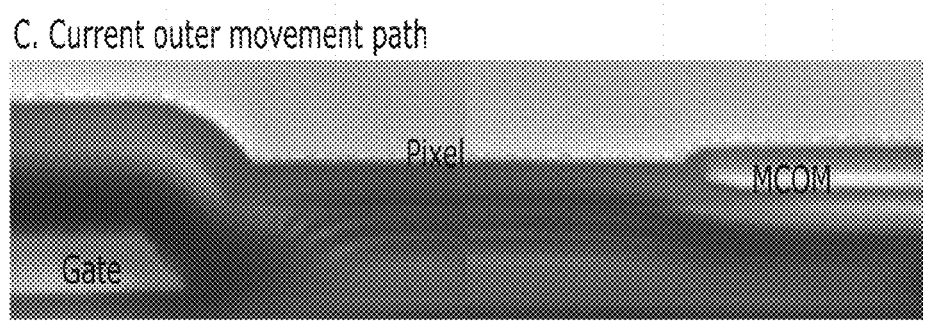

FIGS. 8 to 10 are images of cross-sections of a stack of an exemplary embodiment of the TFT array panel according to the invention. Pass1, Pass2 and GI are used to generally label a first passivation layer, second passivation layer and gate insulating layer.

FIG. 8 is an image of a cross-section of a contact portion of the connecting member and the common voltage line (Gate Contact). As illustrated in FIG. 8, the connecting member is in contact with the common voltage line (GATE) through the contact hole exposing the common voltage line (GATE), such as illustrated in FIG. 3. Accordingly, the connecting member receives a voltage from the common voltage line.

FIG. 9 is an image of a cross-section of a contact portion of the connecting member and the common electrode (MCOM Contact). The connecting member is in contact with the common electrode (MCOM) through the contact hole exposing the upper portion of the common electrode such as illustrated in FIG. 4, and applies a voltage to the common electrode.

That is, in one or more exemplary embodiment of the TFT array panel according to the invention, the common voltage line is in contact with the connecting member and simultaneously the connecting member is in contact with the common electrode, in one single contact hole.

FIG. 10 is an image of a cross-section of an edge region of the connecting member in which the contact hole is not defined in the first passivation layer 180n and the contact hole is defined only in the organic layer 180q. FIG. 10 corresponds to a region of FIG. 2 taken along line IV-IV and FIG. 4.

Referring to FIGS. 2, 4, and 10, the common electrode 270 and the common voltage line 131 are spaced apart from each other at both edges of the connecting member 193. That is, the contact hole is defined only in the organic layer 180q at the edge region of the connecting member 193, so that the connecting member 193 and the common voltage line 131 are insulated from each other by the first passivation layer 180n and the second passivation layer 180z. Similarly, the common electrode 270 and the connecting member 193 are also insulated from each other with the second passivation layer 180z interposed therebetween.

In the exemplary embodiment of the TFT array panel according to the invention, as illustrated in FIGS. 2 and 9, the connecting member 193 is disposed on a relatively steep slope surface having an angle close to 90 degrees) (°). Accordingly, a disconnection of the connecting member 193 may be generated at the steep slope surface. Even though disconnection of the connecting member 193 may be generated, the edge of the connecting member is disposed on a flat surface, not a slope surface, as illustrated in FIGS. 4 and 10, so that it is possible to electrically connect the common voltage line 131 and the common electrode 270 through the edge of the connecting member 193.

Figure 18:
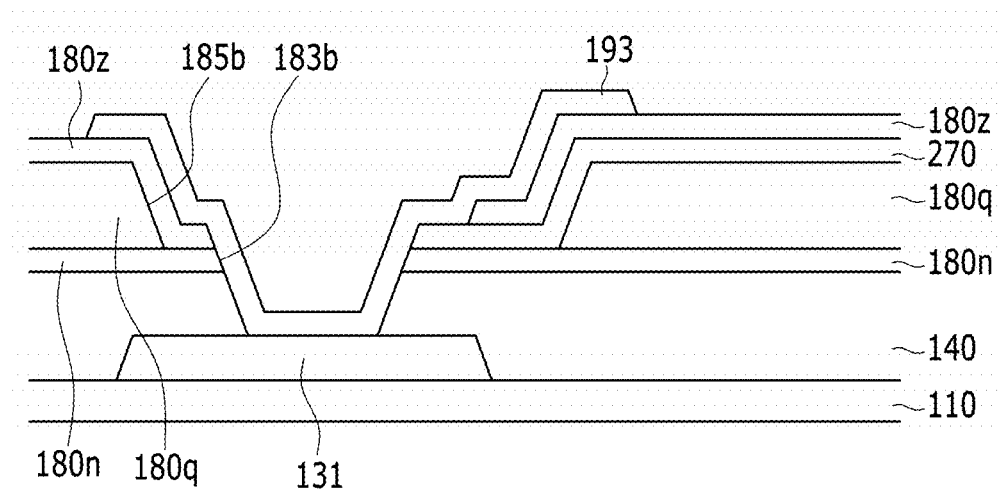
FIG. 18 is a cross-sectional view of another exemplary embodiment of a thin film transistor array panel according to the invention.

Another exemplary embodiment of TFT array panel according to the invention will be described with reference to FIG. 18. Referring to FIG. 18, the TFT array panel is substantially the same as the TFT array panel according to the exemplary embodiment illustrated in FIGS. 1 to 4. A detailed description for the similar constituent elements will be omitted.

In the TFT array panel according to the illustrated exemplary embodiment, a second contact hole 183b defined in a first passivation layer 180n exposes only a part of a common voltage line 131, but does not expose an insulating substrate 110.

A common electrode 270 positioned on the first passivation layer 180n is also positioned to vertically overlap a partial region of the common voltage line 131. That is, the common voltage line 131 is not in direct contact with, but is electrically insulated from the common electrode 270 by a gate insulating layer 140 and the first passivation layer 180n positioned between the common voltage line 131 and the common electrode 270. In the exemplary embodiment illustrated in FIGS. 1 to 4, a virtual vertical (cross-section thickness direction) line extended downwardly from an end of the common electrode 270 does not meet the common voltage line 131, but in the exemplary embodiment illustrated in FIG. 18, a virtual vertical line extended downwardly from an end of the common electrode 270 meets the common voltage line 131.

A width of the second contact hole 183b defined in the first passivation layer 180n becomes smaller than that of the TFT array panel according to the exemplary embodiment illustrated in FIGS. 1 to 4. The width of the second contact hole 183b illustrated in FIG. 18 is smaller than that in the exemplary embodiment illustrated in FIGS. 1 to 4, since the second contact hole 183b in FIGS. 1 to 4 exposes the insulating substrate 110, but the second contact hole 183b illustrated in FIG. 18 does not expose the insulating substrate 110 and exposes the part of the common voltage line 131.

Accordingly, in the TFT array panel according to the exemplary embodiment illustrated in FIG. 18, the width of the second contact hole 183b is minimized, so transmittance of the TFT array panel is further improved.

An exemplary embodiment of a method of manufacturing a TFT array panel according to the invention will be described with reference to FIGS. 11 to 17. FIGS. 11 to 17 are views illustrating an exemplary embodiment of a manufacturing process of a TFT array panel according to the invention.

Figure 11:
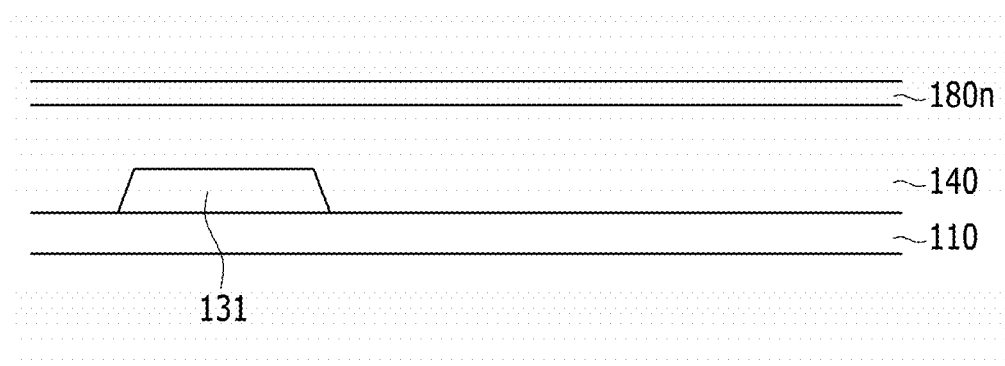
FIGS. 11 to 17 are views illustrating an exemplary embodiment of a manufacturing process of a thin film transistor array panel according to the invention.
Figure 12:
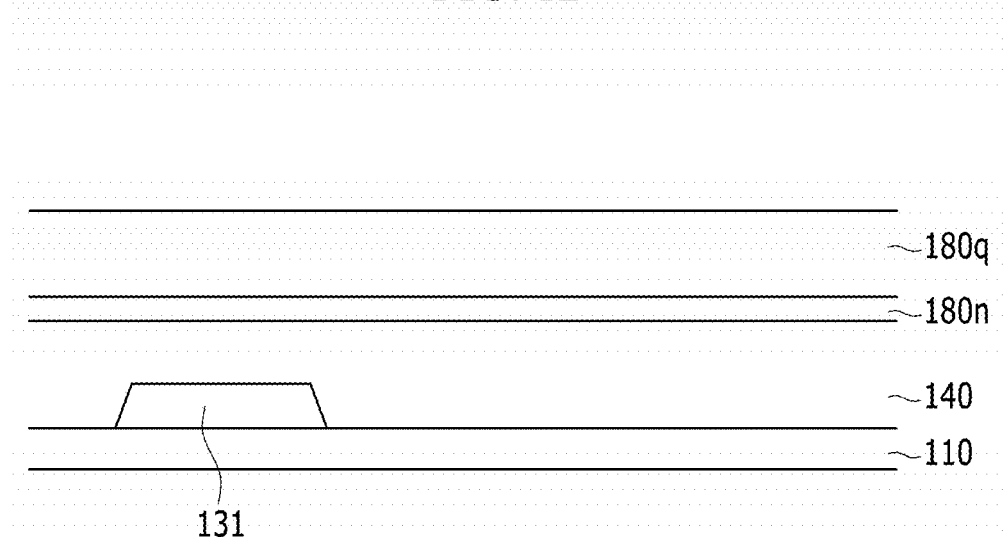

Referring to FIGS. 11 and 12, a gate conductor including a gate line 121 and a common voltage line 131 is formed on an insulating substrate 110 which includes transparent glass, plastics or the like.

The gate conductor may be formed of an aluminum-based metal, such as aluminum (Al) or an aluminum alloy, a silver-based metal, such as silver (Ag) or a silver alloy, a copper-based metal, such as copper (Cu) or a copper alloy, a molybdenum-based metal, such as molybdenum (Mo) or a molybdenum alloy, chromium (Cr), tantalum (Ta), and titanium (Ti).

A gate insulating layer 140 formed of silicon nitride (SiNx), silicon oxide (SiOx), or the like is formed on the gate conductor.

A first passivation layer 180n and an organic layer 180q are sequentially formed on the gate insulating layer 140. The first passivation layer 180n may be formed of an organic insulating material, an inorganic insulating material or the like.

Figure 13:
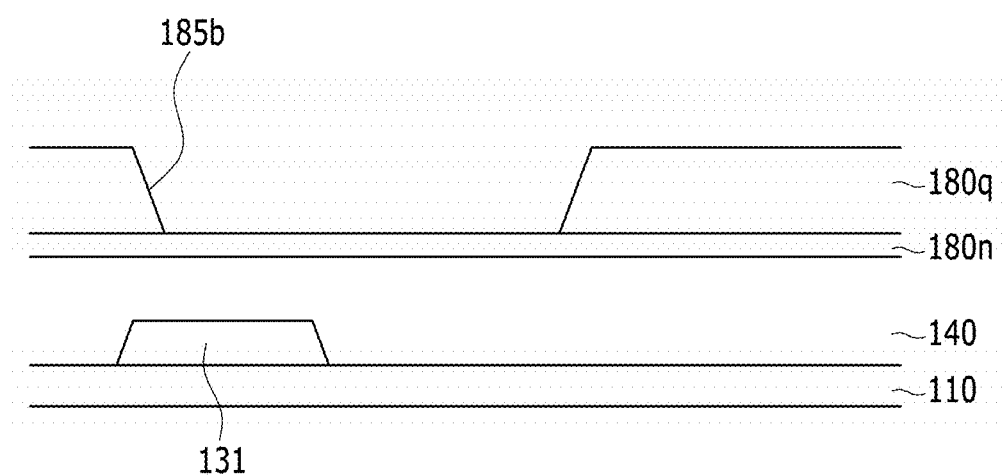

Referring to FIG. 13, a second contact hole 185b is formed by etching the organic layer 180q. A part of the first passivation layer 180n is exposed through the second contact hole 185b.

Figure 14:
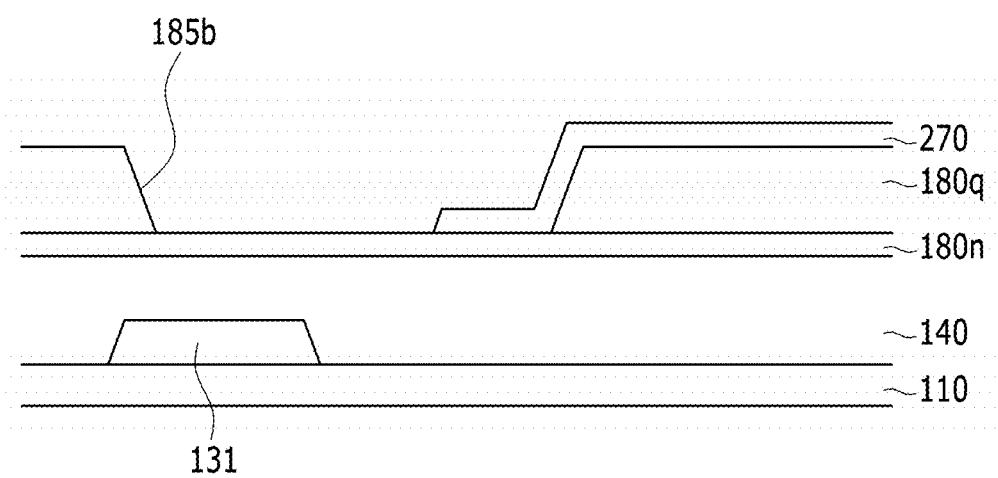

Referring to FIG. 14, a common electrode 270 is formed in a portion of the second contact hole 185b and on the organic layer 180q.

Figure 15:
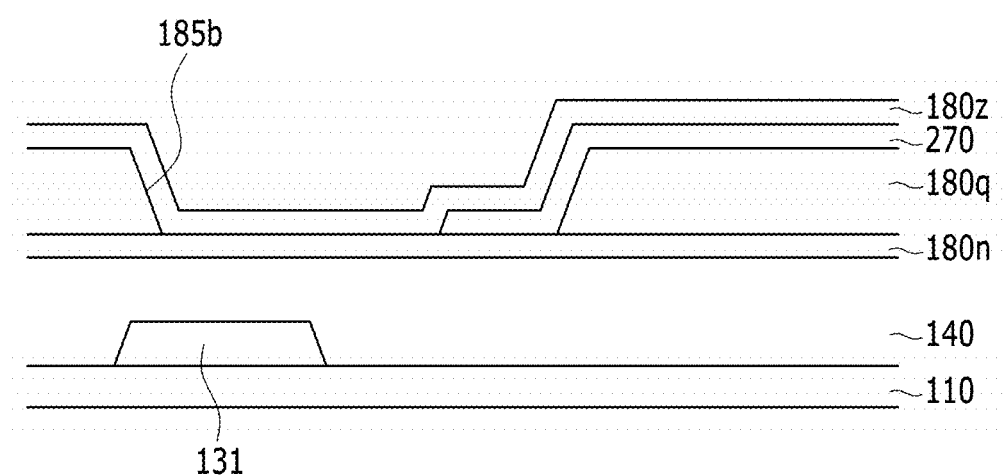

Referring to FIG. 15, a second passivation layer 180z is formed on the common electrode 270, the exposed first passivation layer 180n and the organic layer 180q.

Figure 16:
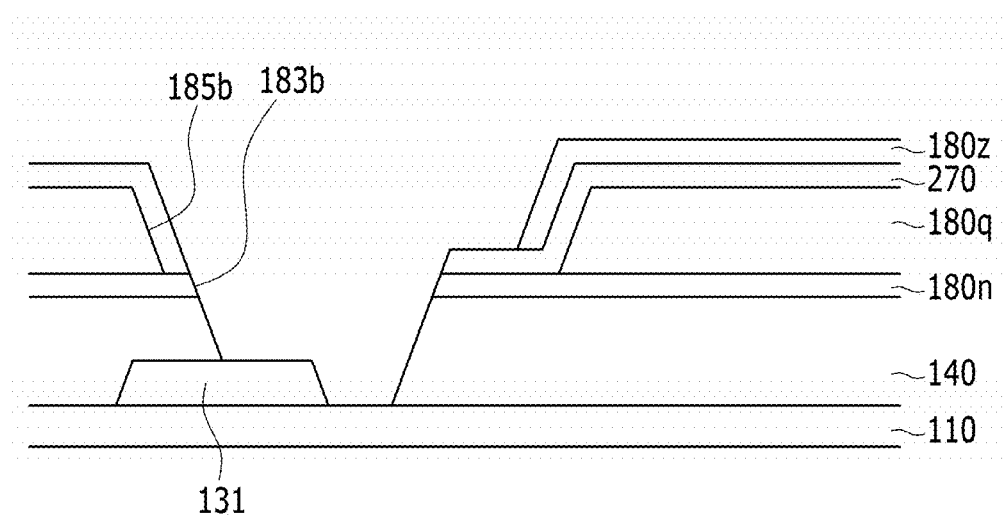

Next, referring to FIG. 16, a second contact hole 183b is formed by etching the first passivation layer 180n, the organic layer 180q and the second passivation layer 180z. The second contact hole 183b exposes a part of the common voltage line 131, a part of the insulating substrate 110 and a part of the common electrode 270.

Figure 17:
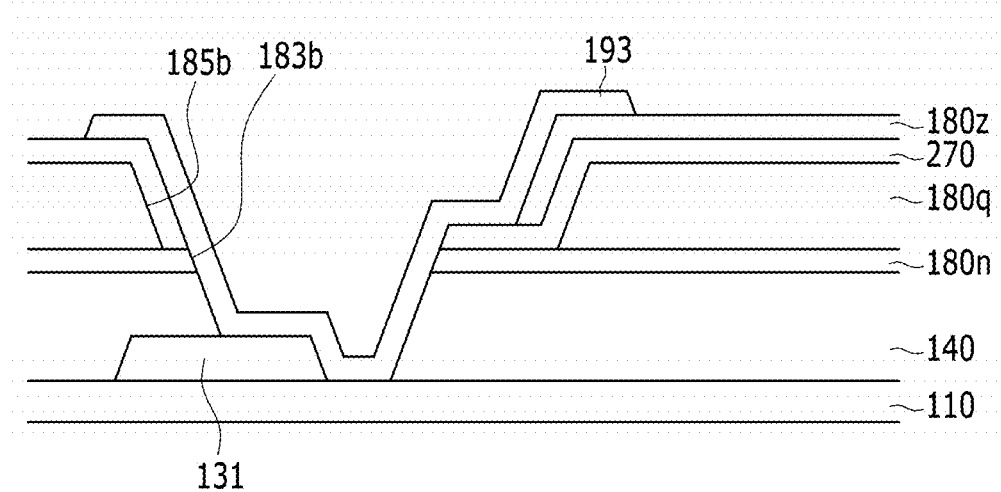

Next, referring to FIG. 17, a connecting member 193 is formed on exposed surfaces of the insulating substrate 110, the common voltage line 131, the common electrode 270 and the second passivation layer. Although not illustrated, the connecting member 193 may be formed simultaneously when forming a pixel electrode 191 of the TFT array panel, such that the connecting member 193 and the pixel electrode 191 are in a same layer of the TFT array panel.

As illustrated in FIG. 17, the connecting member 193 is formed, so that the common voltage line 131 is physically and electrically connected with the connecting member 193, and the connecting member 193 is physically and electrically connected with the common electrode 270, through a same single contact hole collectively formed by 183b and 185b. Accordingly, an electrical current applied to the common voltage line 131 is transmitted to the common electrode 270 by the connecting member 193.

As described above, according to one or more exemplary embodiment of the TFT array panel and the method of manufacturing the same according to the invention, the common electrode is connected with the common voltage line through one single contact hole, so that a process in the method of manufacturing is relatively simple, and the overall number of contact holes in the TFT array panel is decreased, thereby improving transmittance.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A thin film transistor array panel, comprising:
    a substrate;
    a drain electrode of a thin film transistor, on the substrate;
    a gate line and a common voltage line on the substrate and electrically separated from each other;
    a gate insulating layer on the gate line and the common voltage line;
    a first passivation layer on the gate insulating layer;
    a common electrode on the first passivation layer;
    a second passivation layer on the common electrode; and
    a pixel electrode and a connecting member on the second passivation layer and electrically separated from each other,
    wherein
    a first contact hole and a second contact hole are defined in the first and second passivation layers,
    the pixel electrode and the drain electrode are connected to each other through the second contact hole,
    the connecting member and the common electrode contact each other at the first contact hole defined in the first and second passivation layers,
    the common voltage line and the connecting member contact each other at the first contact hole at which the connecting member and the common electrode contact, and the connecting member contacts a side surface and an upper surface of the common electrode at an edge of the common electrode.

2. The thin film transistor array panel of claim 1, further comprising:
an organic layer between the first passivation layer and the common electrode.

3. The thin film transistor array panel of claim 2, wherein:
the first contact hole is defined in each of the first passivation layer, the organic layer and the second passivation layer, and
a width of the first contact hole at the first passivation layer is smaller than a width of the first contact hole at the organic layer and the second passivation layer.

4. The thin film transistor array panel of claim 3, wherein:
a portion of the first contact hole at the first passivation layer exposes the common voltage line and the substrate.

5. The thin film transistor array panel of claim 3, wherein:
the connecting member is vertically elongated in an upper region of the first contact hole, and
opposing edge regions of the connecting member are flat on a portion of the first passivation layer, adjacent to the first contact hole.

6. The thin film transistor array panel of claim 3, wherein:
a portion of the first contact hole at the first passivation layer exposes the common voltage line and does not expose the substrate.

7. The thin film transistor array panel of claim 6, wherein:
an end of the common electrode at the first contact hole overlaps the common voltage line.

8. The thin film transistor array panel of claim 1, wherein:
a portion of the first contact hole at the organic layer and the second passivation layer exposes the common electrode.

9. The thin film transistor array panel of claim 1, wherein:
the connecting member is in contact with a portion of the common electrode, on the first passivation layer and adjacent to the first contact hole.

10. The thin film transistor array panel of claim 1, wherein:
the gate line to which a voltage is applied, is in contact with the pixel electrode via the second contact hole and applies the voltage to the pixel electrode.

11. The thin film transistor array panel of claim 1, wherein:
the common voltage line to which a common voltage is applied, is in contact with the common electrode via the first contact hole and applies the voltage to the common electrode.

* * * * *